US010047256B2

(12) United States Patent
Yoshimoto et al.

(10) Patent No.: US 10,047,256 B2
(45) Date of Patent: *Aug. 14, 2018

(54) EPOXY RESIN COMPOSITION, CURED PRODUCT, HEAT RADIATING MATERIAL, AND ELECTRONIC MEMBER

(71) Applicant: DIC Corporation, Tokyo (JP)

(72) Inventors: Yasuyo Yoshimoto, Sakura (JP); Atsushi Oshio, Sakura (JP); Kunihiro Morinaga, Ichihara (JP); Hiroshi Kinoshita, Sakura (JP); Daisuke Ito, Sakura (JP)

(73) Assignee: DIC Corporation, Tokyo (JP)

( * ) Notice: Subject to any disclaimer, the term of this patent is extended or adjusted under 35 U.S.C. 154(b) by 87 days.

This patent is subject to a terminal disclaimer.

(21) Appl. No.: 14/772,452

(22) PCT Filed: Mar. 4, 2014

(86) PCT No.: PCT/JP2014/055463
§ 371 (c)(1),
(2) Date: Dec. 21, 2015

(87) PCT Pub. No.: WO2014/136773
PCT Pub. Date: Sep. 12, 2014

(65) Prior Publication Data
US 2016/0122604 A1    May 5, 2016

(30) Foreign Application Priority Data

Mar. 6, 2013    (JP) ................................ 2013-043991
May 27, 2013   (JP) ................................ 2013-110861

(51) Int. Cl.
| C08G 59/06 | (2006.01) |
| C08G 59/32 | (2006.01) |
| C08L 63/00 | (2006.01) |
| C09J 163/00 | (2006.01) |
| C09J 11/04 | (2006.01) |
| C09J 11/06 | (2006.01) |
| C09J 9/00 | (2006.01) |
| C08K 3/00 | (2018.01) |
| C08K 3/10 | (2018.01) |
| C08K 3/22 | (2006.01) |
| C08K 3/36 | (2006.01) |
| C09K 5/14 | (2006.01) |
| H01L 23/29 | (2006.01) |
| H01L 23/31 | (2006.01) |
| H05K 1/03 | (2006.01) |
| H05K 7/20 | (2006.01) |
| C08K 7/18 | (2006.01) |
| C08K 9/06 | (2006.01) |

(52) U.S. Cl.
CPC ............ *C09J 163/00* (2013.01); *C08G 59/32* (2013.01); *C08K 3/36* (2013.01); *C08L 63/00* (2013.01); *C09J 9/00* (2013.01); *C09J 11/04* (2013.01); *C09K 5/14* (2013.01); *H01L 23/293* (2013.01); *H05K 1/0373* (2013.01); *C08K 7/18* (2013.01); *C08K 9/06* (2013.01); *H01L 23/295* (2013.01); *H01L 2924/0002* (2013.01)

(58) Field of Classification Search
CPC ..... C08G 59/32; C08G 59/3218; C08L 63/00; C09D 163/00; C09J 163/00; C08K 3/10; C08K 3/22; C08K 3/36; C08K 7/18; C08K 9/06; H01L 23/293; H01L 23/295; H05K 1/0373
See application file for complete search history.

(56) References Cited

U.S. PATENT DOCUMENTS

| 5,302,672 A | 4/1994 | Ogura et al. |
| 6,037,426 A | 3/2000 | Shimizu et al. |
| 2011/0124775 A1 | 5/2011 | Wada |
| 2015/0353456 A1* | 12/2015 | Yoshimoto ........... C07D 303/27 525/523 |

FOREIGN PATENT DOCUMENTS

| CN | 104684902 A | 6/2015 |
| EP | 1184419 A2 | 3/2002 |
| JP | 59-098027 A | 6/1984 |
| JP | 61-178974 A | 8/1986 |
| JP | 01-168633 A | 7/1989 |
| JP | 04-217675 A | 8/1992 |
| JP | 04-337314 A | 11/1992 |

(Continued)

OTHER PUBLICATIONS

Handbook of Fillers, 3d edition, Table Data: Physical and Chemical Properties (2010).*
Machine translation of JP 2001089644 A.*
Machine translation of JP 2007308640 A.*
International Search Report dated May 27, 2014, issued for PCT/JP2014/055463.
Matsushita, M et al., "Heterogeneously Catalyzed Aerobic Oxidative Biaryl Coupling of 2-Naphthols and Substituted Phenols in Water," Journal of American Chemical Society, 2005, vol. 127, No. 18, pp. 6632-6640.
Kurt, B. et al., "Uber das 2,7,2',7'-Tetraoxy-dinaphthyl-(1.1')", Chemische Berichte, 1937, vol. 70, p. 1341-1348.

(Continued)

*Primary Examiner* — Kregg T Brooks
(74) *Attorney, Agent, or Firm* — Locke Lord LLP

(57) ABSTRACT

The present invention provides an epoxy resin composition including 2,2',7,7'-tetraglycidyloxy-1,1'-binaphthalene as an epoxy resin (A), and a filler (B). Further, the present invention provides an epoxy resin composition in which the filler (B) in the epoxy resin composition is a thermally conductive filler and an epoxy resin composition in which the filler (B) is silica. Further, the present invention provides a cured product produced by curing the epoxy resin composition of the present invention and a heat dissipation material and an electronic material each including the cured product.

20 Claims, No Drawings

(56) References Cited

FOREIGN PATENT DOCUMENTS

| JP | 06-184131 A | | 7/1994 |
|---|---|---|---|
| JP | 08-245459 A | | 9/1996 |
| JP | 2001-39913 A | | 2/2001 |
| JP | 3137202 B | | 2/2001 |
| JP | 2001-089644 A | | 4/2001 |
| JP | 2001089644 A | * | 4/2001 |
| JP | 2004-111380 A | | 4/2004 |
| JP | 2007-308640 A | | 11/2007 |
| JP | 2007308640 A | * | 11/2007 |
| JP | 2010-024417 A | | 2/2010 |
| JP | 2010-106150 A | | 5/2010 |
| JP | 2011-037941 A | | 2/2011 |
| TW | 575631 B | | 2/2004 |
| WO | WO-2014050789 A1 | | 4/2014 |

OTHER PUBLICATIONS

Sakamoto, T. et al., "Catalytic Activities of $CuSO_4/Al_2O_3$ in Dehydrogenation of Arenes by Dioxygen," Journal of Organic Chemisty, 1997, vol. 62, No. 10, pp. 3194-3199.

International Search Report dated Nov. 19, 2013, issued for PCT/JP2013/075649.

Shun-jun Ji, "Microwave-assisted efficent oxidative coupling of 2-naphthols in the solid state," Synthetic Communications, 2002, vol. 32. No. 19, pp. 3069-3074.

Notification of the First Office Action, issued in corresponding Chinese Patent Application No. CN 201380050884.5, dated Nov. 3, 2015.

Notification of Reasons for Refusal, issued in corresponding Japanese Patent Application No. JP 2014-538480, dated Dec. 17, 2014.

Notification of Reasons for Refusal, issued in corresponding Korean Patent Application No. KR 10-2015-7006104, dated May 16, 2016.

Zhang Yu Dragon et al., "Practical Ceramic Materials Manual 1st edition," Chemical Industry Publishers, Materials Science and Process Publishing Center, Jul. 2006, pp. 364-366 and English comment is included.

Office Action dated May 31, 2016, issued for the Chinese patent application No. 201480025275.9 and English translation thereof.

Office Action dated Feb. 15, 2017, issued for the Chinese patent application No. 201480025275.9 and English translation thereof.

European Search Report and European Search Opinion dated Oct. 17, 2017, issued for the European patent application No. 17 171 997.4.

European Search Report and European Search Opinion dated Oct. 11, 2016, issued for the European patent application No. 14 760 547.1.

Office Action dated Jan. 22, 2015, issued for the Japanese patent application No. 2014-056368 and English translation thereof.

Office Action dated Dec. 3, 2015, issued for the Japanese patent application No. 2014-040373 and English translation thereof.

Office Action dated Jul. 5, 2016, issued for the Korean patent application No. 10-2015-7027444 and English translation thereof.

Office Action dated Jun. 20, 2017, issued for the Taiwanese patent application No. 103107558 and partial machine English translation thereof.

* cited by examiner

EPOXY RESIN COMPOSITION, CURED PRODUCT, HEAT RADIATING MATERIAL, AND ELECTRONIC MEMBER

TECHNICAL FIELD

The present invention relates to an epoxy resin composition excellent in heat resistance and excellent in adhesion and thermal conductivity or low moisture absorption and low thermal expansibility of a resultant cured product, and also relates to a cured product, a heat dissipation material, and an electronic material.

BACKGROUND ART

Epoxy resin compositions each containing an epoxy resin are widely used in laminated-plate resin materials, electric insulating materials, semiconductor encapsulating materials, fiber-reinforced composite materials, coating materials, molding materials, adhesive materials, etc. in view of the excellent physical properties such as heat resistance, low moisture absorption, and the like.

In recent years, in these various applications, particularly in the field of advanced materials, durability performance characterized by heat resistance has been required to be further improved. In particular, with miniaturization and higher integration of electronic materials, resins exhibiting high heat resistance have been required for bonding a substrate, a circuit, and a module. In particular, higher functional epoxy resins having heat dissipation and low thermal expansibility in addition to high heat resistance are required for normally operating semiconductor modules which easily become a high temperature.

For example, tetrafunctional naphthalene-based epoxy resins represented by a structural formula (1) below

[Chem. 1]

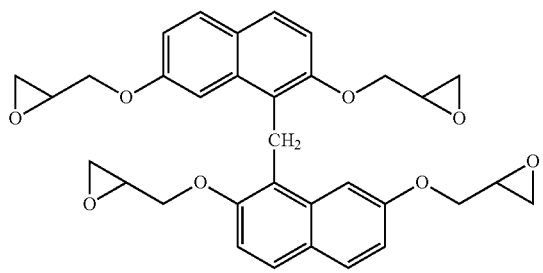

(1)

are known as epoxy resin materials which can comply with the requirements for high degrees of heat resistance, low moisture absorption, and low thermal expansibility (Patent Literature 1).

In comparison with general phenol novolac-type epoxy resins, the tetrafunctional naphthalene-based epoxy resins have a naphthalene skeleton having high heat resistance and high hydrophobicity, a high crosslink density due to tetra-functionality, and a molecular structure with excellent symmetry, and thus cured products thereof exhibit very excellent heat resistance. However, higher performance has recently been required for heat resistance, and further improvement has been required. Further, since the tetrafunctional naphthalene-based epoxy resins have low solubility in solvents, the characteristics of the cured products have been not sufficiently exhibited in, for example, manufacture of electronic circuit boards.

It is considered to be effective as a method for improving heat resistance that in the tetrafunctional naphthalene-based epoxy resins, naphthalene rings are directly bonded to each other, not bonded through a methylene structure, because the methylene structure is relatively weak against high temperatures. There is described an epoxy resin having a bi(dihydroxynaphthalene) structure in which a dihydroxynaphthalene dimer has a direct single bond without containing a methylene structure (Patent Literatures 3 to 6). The positions of hydroxyl groups in dihydroxynaphthalene and the bond position in a dimer are important factors which influence the physical properties of an epoxy resin using the resin, such as the softening point, solvent solubility, the heat resistance of cured products thereof, and the like. However, any one of Patent Literatures 2 to 5 does not specify the positions of hydroxyl groups in dihydroxynaphthalene and the bond position in a dimer, and does not describe specific compounds.

CITATION LIST

Patent Literature

PTL 1: Japanese Patent No. 3137202
PTL 2: Japanese Unexamined Patent Application Publication No. 2004-111380
PTL 3: Japanese Unexamined Patent Application Publication No. 2007-308640
PTL 4: Japanese Unexamined Patent Application Publication No. 2010-24417
PTL 5: Japanese Unexamined Patent Application Publication No. 2010-106150

SUMMARY OF INVENTION

Technical Problem

A problem to be solved by the present invention is to provide a high-functional epoxy resin composition which exhibits excellent heat resistance and further produces a cured product exhibiting adhesion and thermal conductivity or low moisture absorption and low thermal expansibility, and also provide a cured product thereof.

Solution to Problem

As a result of earnest research, the inventors found that 1,1'-binaphthalene-2,2',7,7'-tetraol with high purity can be produced by selective coupling reaction of 2,7-dihydroxynaphthalene at the 1,1'-positions in dimerization reaction of dihydroxynaphthalene, and an epoxy resin composition containing 2,2',7,7'-tetraglycidyloxy-1,1'-binaphthalene, which is produced by reaction of 1,1'-binaphthalene-2,2',7,7'-tetraol with epihalohydrin, and a filler exhibits not only excellent heat resistance but also adhesion and thermal conductivity or low moisture absorption and low thermal expansibility and further exhibits good solvent solubility, leading to the achievement of the present invention.

That is, the present invention relates to an epoxy resin composition containing as essential components an epoxy resin (A), which is 2,2',7,7'-tetraglycidyloxy-1,1'-binaphthalene, and a filler (B).

Further, the present invention relates to an epoxy resin composition in which the filler (B) is a thermally conductive filler.

Further, the present invention relates to an epoxy resin composition in which the thermally conductive filler has a thermal conductivity of 10 W/m·K or more.

Further, the present invention relates to an epoxy resin composition in which the thermally conductive filler is at least one selected from alumina, magnesium oxide, zinc oxide, beryllia, boron nitride, aluminum nitride, silicon nitride, silicon carbide, boron carbide, titanium carbide, and diamond.

Further, the present invention relates to an epoxy resin composition in which the filler (B) is silica.

Further, the present invention relates to an epoxy resin composition containing a fibrous base material in addition to the filler (B).

Further, the present invention relates to an epoxy resin composition for a thermally conductive adhesive and an electronic material.

Further, the present invention relates to a cured product produced by curing the epoxy resin composition, a heat dissipation material, and an electronic material.

Advantageous Effects of Invention

According to the present invention, it is possible to provide an epoxy resin composition which not only exhibits excellent heat resistance but also exhibits adhesion and thermal conductivity or low moisture absorption and low thermal expansibility, and which further realizes good solvent solubility, also provide a cured product thereof. In addition, the epoxy resin composition of the present invention can be preferably used as a thermally conductive adhesive having high thermal conductivity or an electronic material having a low coefficient of linear expansion.

DESCRIPTION OF EMBODIMENTS

The present invention is described in detail below.
<Epoxy Resin (A)>
An epoxy resin (A) used in the present invention contains as a main component 2,2',7,7'-tetraglycidyloxy-1,1'-binaphthalene represented by structural formula 2 below.

[Chem. 2]

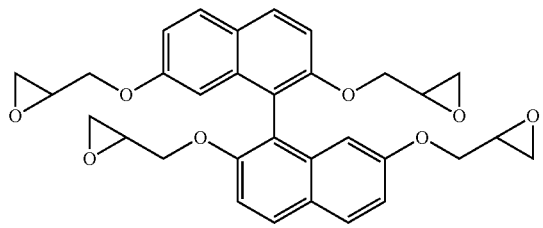

(2)

1,1'-Binaphthalene]-2,2',7,7'-tetraol which is a raw material of the epoxy resin (A) of the present invention can be produced by coupling reaction of dihydroxynaphthalene. In the coupling reaction of dihydroxynaphthalene, a multimer cannot be easily produced because of selective coupling reaction of 2,7-dihydroxynaphthalene at the 1,1'-positions, and the resultant 1,1'-binaphthalene-2,2',7,7'-tetraol has a lower melting point than 1,1'-methylenebis(naphthalene-2,7-diol having a similar structure. In addition, a diglycidyl ether thereof has a lower softening point, lower viscosity, and higher solvent solubility than a tetrafunctional diglycidyl ether of 1,1'-methylenebis(naphthalene-2,7-diol].

The method for producing the epoxy compound (A) used in the present invention is described in detail below, but the method for producing the epoxy compound (A) of the present invention is not limited to this.

That is, the method for producing the epoxy compound (A) used in the present invention includes reacting 1,1'-binaphthalene-2,2',7,7'-tetraol with epihalohydrin. A specific example of the method includes adding epihalohydrin at a ratio of 2 to 10 times (molar basis) the number of moles of phenolic hydroxyl groups in a phenol compound, and performing reaction at a temperature of 20° C. to 120° C. for 0.5 to 10 hours while further adding at a time or gradually a basic catalyst at a ratio (molar basis) of 0.9 to 2.0 times the number of moles of the phenolic hydroxyl groups. The basic catalyst used may be a solid or an aqueous solution thereof, and when the aqueous solution is used, the method may be performed by continuously adding the catalyst, continuously distilling off water and epihalohydrin from the reaction mixture under reduced pressure or atmospheric pressure, and further removing water by liquid separation and continuously returning epihalohydrin to the reaction mixture.

In industrial production, new epihalohydrin is used in preparation of a first batch for producing an epoxy resin, but in a second batch or later, epihalohydrin recovered from the crude reaction product can be combined with new epihalohydrin corresponding to a loss due to the consumption by the reaction, thereby causing an economical advantage. In this case, the epihalohydrin used is not particularly limited, and examples thereof include epichlorohydrin, epibromohydrin, β-methylepichlorohydrin, and the like. In view of industrially easy availability, epichlorohydrin is particularly preferred.

Specific examples of the basic catalyst include alkaline-earth metal hydroxides, alkali metal carbonates, alkali metal hydroxides, and the like. In view of excellent catalyst activity in epoxy resin synthesis reaction, alkali metal hydroxides are particularly preferred, and examples thereof include sodium hydroxide, potassium hydroxide, and the like. When used, the basic catalyst may be used in the form of an aqueous solution of about 10% to 55% by mass or may be used in a solid form. In addition, the reaction rate of synthesis of an epoxy resin can be increased by combining an organic solvent. Examples of the organic solvent include, but are not particularly limited to, ketones such as acetone methyl ethyl ketone, and the like; alcohols such as methanol, ethanol, 1-propylalcohol, isopropylalcohol, 1-butanol, secondary butanol, tertiary butanol, and the like; cellosolves such as methyl cellosolve, ethyl cellosolve, and the like; ethers such as tetrahydrofuran, 1,4-dioxane, 1,3-dioxane, diethoxyethane, and the like; and aprotic polar solvents such as acetonitrile, dimethylsulfoxide, dimethylformamide, and the like. These organic solvents may be used alone or in appropriate combination of two or more in order to adjust polarity.

The product of the epoxidation reaction is washed with water and then unreacted epihalohydrin and the organic solvent combined are distilled off by distillation under heating and reduced pressure. Further, in order to produce an epoxy resin containing little hydrolyzable halogen, the resultant epoxy resin can be dissolved again in an organic solvent such as toluene, methyl isobutyl ketone, methyl ethyl ketone, or the like, and an aqueous solution of an alkali meta hydroxide such as sodium hydroxide, potassium hydroxide, or the like can be added to the resultant solution and subjected to further reaction. In this case, a phase transfer catalyst such as a quaternary ammonium salt, crown ether, or the like may be present for the purpose of improving the reaction rate. When the phase transfer catalyst is used, the amount of use is preferably a ratio of 0.1 to 3.0 parts by mass relative to 100 parts by mass of the epoxy resin used. After the finish of the reaction, the produced salt is removed by filtration and washing with water, and further the solvent such as toluene, methyl isobutyl ketone, or the like is removed by distillation under heating and reduced pressure, whereby the target epoxy resin (A) as the essential component of the present invention can be produced.

Next, the epoxy resin composition of the present invention contains the epoxy resin (A) detailed above and the filler (B), and the epoxy resin (A) may be used as a production reaction product containing an oligomer component.

<Filler (B)>

The epoxy resin composition of the present invention contains the epoxy resin (A) detailed above and the filler (B).

<Thermally Conductive Filler>

When the epoxy resin composition of the present invention contains a thermally conductive filler as the filler (B), the epoxy resin composition can be preferably used as a thermally conductive material. The epoxy resin composition of the present invention has very high heat resistance and thus can be particularly preferably used as a heat dissipation material among thermally conductive materials.

A known common metal-based filler, inorganic compound filler, carbon-based filler, and the like can be used as the thermally conductive filler. Specific examples thereof include metal-based fillers such as silver, copper, aluminum, iron, stainless, and the like; inorganic fillers such as alumina, magnesia, beryllia, silica, boron nitride, aluminum nitride, silicon nitride, silicon carbide, boron carbide, titanium carbide, and the like; and carbon-based fillers such as diamond, graphite, graphite, carbon fibers, and the like. At least one thermally conductive filler is selected and used, but one or combination of a plurality of types having different crystal forms, particle sizes, or the like can be used. When heat dissipation is required in application to an electronic apparatus or the like, electric insulation is often required. In this case, it is preferred to use at least one selected from alumina, magnesium oxide, zinc oxide, beryllia, boron nitride, aluminum nitride, silicon nitride, and diamond, which all have high thermal conductivity and high volume resistivity among these fillers. Because a filling amount of the thermally conductive filler relative to the epoxy resin composition is limited and an excessively large filling amount causes deterioration in the physical properties such as adhesion and the like, for example, in the use as a thermally conductive adhesive, the thermally conductive filler having high thermal conductivity is preferably used, and the thermally conductive film of 10 W/m·K or more is more preferably used.

In particular, alumina, aluminum nitride, boron nitride, silicon nitride, and magnesium oxide are preferred in view of securing thermal conductivity and insulation, and alumina is more preferred because of its good filling property for a resin in addition to thermal conductivity and insulation.

The thermally conductive filler which is surface-treated can also be used. For example, the inorganic filler having surfaces modified with a silane-based, titanate-based, or aluminate-based coupling agent can be used.

The average particle diameter of the thermally conductive filler is not particularly limited, and the preferred lower limit and upper limit are 0.2 μm and 50 μm, respectively. When the average particle diameter of the thermally conductive filler is less than 0.2 μm, the viscosity of a curable resin composition may be increased, thereby decreasing workability or the like. The use of a large amount of the thermally conductive filler having an average particle diameter exceeding 50 μm may increase curvature of an electronic component, cause cracking or peeling in a cold cycle or the like, or cause peeling at a bonding interface because of insufficient adhesion between a cured product of the curable resin composition and a substrate. The more preferred lower limit and upper limit of the average particle diameter of the thermally conductive filler are 0.4 μm and 20 μm, respectively.

The shape of the thermally conductive filler is not particularly limited and is preferably closer to a spherical shape in view of mobility of a thermally conductive epoxy resin composition. For example, the aspect ratio (ratio of the long-axis length of particles to the short-axis length of particles (long-axis length/short-axis length)) is not particularly limited and is preferably closer to 1, preferably 1 to 80, and more preferably 1 to 10.

The content of the thermally conductive filler in the thermally conductive composition is not particularly limited and the thermally conductive filler is mixed according to the degree of thermal conductivity required for application. The content of the thermally conductive filler is preferably 40 to 90 parts by weight in 100 parts by weight of the curable resin composition. When the content of the thermally conductive filler is less than 40 parts by weight, the curable resin composition does not have satisfactory thermal conductivity. When the content of the thermally conductive filler exceeds 90 parts by weight, insufficient adhesion between a cured product of the thermally conductive resin composition and a substrate increases curvature of an electronic component, causes cracking or peeling in a cold cycle or the like, or causes peeling at a bonding interface. Also, when the content of the thermally conductive filler exceeds 90 parts by weight, the viscosity of the curable resin composition is increased, thereby degrading coatability, workability, and the like. In order to effectively exhibit the function of the thermally conductive filler and achieve high thermal conductivity, higher filling of the thermally conductive filler is preferred, and the use of 60 to 90 parts by weight is preferred. The use of 60 to 85 parts by weight is more preferred also in view of mobility of the curable resin composition.

The thermally conductive filler is preferably used as a mixture of two or more types having different particle diameters, and thus the thermally conductive filler having a smaller particle diameter is packed in voids of the thermally conductive filler having a larger particle diameter. Therefore, higher thermal conductivity can be exhibited because of denser packing as compared with the use of only the thermally conductive filler having a single particle diameter. Specifically, when aluminum oxide is used, particles having an average particle diameter of 5 to 20 μm (large particle diameter) at a ratio within a range of 45% to 75% by weight and particles having an average particle diameter of 0.4 to 1.0 μm (small particle diameter) at a ratio within a range of 25% to 55% by weight are preferably mixed in the thermally conductive filler because of smaller temperature dependency of thermal conductivity.

<Filler for Electronic Material>

When the epoxy resin composition of the present invention is used for an electronic material, various fillers such as fused silica, crystalline silica, alumina, silicon nitride, aluminum hydroxide, and the like are used for improving heat resistance, imparting flame retardancy, decreasing low dielectric constant, decreasing the coefficient of linear expansion, and the like.

For example, when the epoxy resin composition is used as an electronic material for a semiconductor encapsulating material, silica is preferably used as the filler (B) because heat resistance can be improved and the coefficient of linear expansion can be decreased. Examples of silica include fused silica, crystalline silica, and the like. When the amount of the filler (B) mixed is particularly increased, fused silica is preferably used. The fused silica can be used in either a crushed shape or a spherical shape, but the spherical shape is mainly preferably used for increasing the amount of the fused silica mixed and suppressing an increase in melt viscosity of a molding material. Further, in order to increase the amount of spherical silica mixed, the grain size distribution of the spherical silica is preferably properly adjusted. The filling rate is preferably as high as possible in view of flame retardancy, and is particularly preferably 65% by mass or more relative to the total amount of the epoxy resin composition.

Also, in the use for an electronic circuit board or the like, aluminum hydroxide is preferably used for imparting flame retardancy.

<Fibrous Base Material>

Also, the present invention can further contain a fibrous base material. By adding a fibrous base material, the epoxy resin composition of the present invention can be imparted with strength and a low coefficient of linear expansion and can be preferably used as a fiber-reinforced resin. Examples of the fibrous base material used include plant fibers, glass fibers, carbon fibers, aramid fibers, and the like, and a woven fabric, a nonwoven fabric, or a fiber assembly or dispersion may be used. Specific examples of the fibrous base material include paper, a glass fabric, a glass nonwoven fabric, aramid paper, an aramid fabric, an aramid nonwoven fabric, a glass mat, a glass robing cloth, and the like. For example, in use as an electronic circuit board, glass fibers are preferred because strength and a low coefficient of linear expansion can be imparted. For example, in forming a prepreg using glass fibers, a glass fabric having a glass fiber diameter of 10 μm or less and a fiber density of 40 to 80 fibers/inch and being treated with a silane coupling agent such as an epoxy silane coupling agent or aminosilane coupling agent, or the like is preferred from the viewpoint of mobility (impregnating property) of the resin. The glass fabric is more preferably treated for minimizing a net space between warp and weft threads. A glass nonwoven fabric preferably has a fabric weight of 15 g/m2 and a thickness of 0.1 mm to a fabric weight of 120 g/m2 and a thickness of 1.0 mm. The fibrous base material used in the present invention preferably has a thickness of 100 μm or less in view of the purpose of use.

<Modification of Filler (B)>

The filler (B) of the present invention can also be surface-treated and used. For example, the inorganic filler having surfaces modified with a silane-based, titanate-based, or aluminate-based coupling agent can be used.

In view of mobility of the epoxy resin composition, the filler (B) treated with the coupling agent is preferably used in many cases, and, for example, adhesion between the resin and the filler (B) in a cured product can be further enhanced by surface treatment. For example, in the case of the thermally conductive filler, interface thermal resistance between the resin and the thermally conductive filler is decreased, thereby improving thermal conductivity.

Among the coupling agents, a silane-based coupling agent is preferably used, and examples of the silane coupling agent include vinyl trichlorosilane, vinyl triethoxysilane, vinyl trimethoxysilane, γ-methacryloxypropyl trimethoxysilane, β(3,4-epoxycyclohexyl)ethyl trimethoxysilane, γ-glycidoxypropyl trimethoxysilane, γ-glycylmethoxypropylmethyl diethoxysilane, N-β(aminoethyl) γ-aminopropyl trimethoxysilane, N-β(aminoethyl) γ-aminopropylmethyl dimethoxysilane, γ-aminopropyl triethoxysilane, N-phenyl-γ-aminopropyl trimethoxysilane, γ-mercaptopropyl trimethoxysilane, γ-chloropropyl trimethoxysilane, and the like.

Surface treatment can be performed by a known common method for modifying surfaces of a filler, and examples of the method which can be used include a spray method using a fluid nozzle, a dry method using stirring with shearing force, a ball mill, a mixer, or the like, and a wet method using an aqueous system or organic solvent system, or the like. The surface treatment using shearing force is preferably performed in such a degree that the filler (B) is not damaged.

The temperature in the system of the wet method or the drying method after treatment in the wet method is appropriately determined according to the type of the surface treatment agent within a range where thermal decomposition does not occur. For example, in treatment with γ-aminopropyl triethoxysilane, the temperature is preferably 80° C. to 150° C.

<Other Compound>

The epoxy resin composition of the present invention may contain a curing agent. The curing agent is not particularly limited, and any compound generally used as a curing agent for usual epoxy resins can be used. Examples of the curing agent include amine compounds, amide compounds, acid anhydride compounds, phenol compounds, and the like. Specific examples of the amine compounds include diaminodiphenylmethane, diethylene triamine, triethylene tetramine, diaminodiphenyl sulfone, isophorone diamine, imidazole, $BF_3$-amine complex, guanidine derivatives, and the like. Examples of the amide compounds include dicyandiamide, polyamide resin synthesized by a linolenic acid dimer and ethylenediamine, and the like. Examples of the acid anhydride compounds include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride, and the like. Examples of the phenol compounds include polyhydric phenol compounds such as phenol novolac resins, cresol novolac resins, aromatic hydrocarbon formaldehyde resin-modified phenol resins, dicyclopentadiene phenol-added resins, phenol aralkyl resins (Xyloc resins), polyhydric phenol novolac resins represented by resorcin novolac resins, which are synthesized from polyhydric hydroxyl compounds and formaldehyde, naphthol aralkyl resins, trimethylol methane resins, tetraphenylol ethane resins, naphthol novolac resins, naphthol-phenol condensed novolac resins, naphthol-cresol condensed novolac resins, biphenyl-modified phenol resins (polyhydric phenol compounds in which phenol nuclei are connected through a bismethylene group), biphenyl-modified naphthol resins (polyhydric naphthol compounds in which phenol nuclei are connected through a bismethylene group), aminotriazine-modified phenol resins (polyhydric phenol compounds in which phenol nuclei are connected through melamine or benzoguanamine), alkoxy group-containing aromatic ring-modified novolac resins (polyhydric phenol compounds in which a phenol nucleus and an alkoxy group-containing aromatic ring are connected through formaldehyde), and the like. These curing agents may be used alone or in combination of two or more.

When the epoxy resin composition of the present invention is used as an adhesive, the epoxy resin composition is preferably uniformly applied to an adhesion surface, and thus the curing agent which is a liquid or becomes liquid at a low temperature of 100° C. or less is preferably used because a liquid or even a solid is required to exhibit mobility at a low temperature. Such a curing agent is, for example, an acid anhydride compound, and particularly preferably used is methyltetrahydrophthalic anhydride, methyl-end-methylene tetrahydrophthalic anhydride, methylbutenyl tetrahydrophthalic anhydride, dodecenylsuccinic anhydride, or methylhexahydrophthalic anhydride, which is liquid at room temperature.

The amounts of the epoxy resin and curing agent mixed in the epoxy resin composition of the present invention are not particularly limited, but in view of the good characteristics of the resultant cured product, the amount of active groups in the curing agent is preferably 0.7 to 1.5 equivalents relative to a total of 1 equivalent of epoxy groups in the epoxy resin.

If required, the epoxy resin composition of the present invention can be properly combined with a curing accelerator. Various compounds can be used as the curing accelerator, and examples thereof include phosphorus-based compounds, tertiary amines, imidazole, organic acid metal salts, Lewis acids, amine complex salts, and the like.

The 2,2',7,7'-tetraglycidyloxy-1,1'-binaphthalene described above may be singly used as an epoxy resin component in the epoxy resin composition of the present invention, but the epoxy resin component may be combined with another epoxy resin within a range in which the effect of the present invention is not impaired. Specifically, the other epoxy resin can be combined within a range of 30% by mass or more, preferably 40% by mass or more, relative to the total mass of the epoxy resin component.

Various epoxy resins can be used as the other epoxy resin combined with the 2,2',7,7'-tetraglycidyloxy-1,1'-binaphthalene described above, and examples thereof include bisphenol A epoxy resins, bisphenol F epoxy resins, resorsin-type epoxy resins, biphenyl epoxy resins, tetramethylbiphenyl epoxy resins, phenol novolac epoxy resins, cresol novolac epoxy resins, bisphenol A novolac epoxy resins, triphenylmethane epoxy resins, tetraphenylethane epoxy resins, dicyclopentadiene-phenol addition reaction-type epoxy resins, phenolaralkyl epoxy resins, naphthol novolac epoxy resins, naphtholaralkyl epoxy resins, naphthol-phenol condensed novolac epoxy resins, naphthol-cresol condensed novolac epoxy resins, aromatic hydrocarbon formaldehyde resin-modified phenol resin-type epoxy resins, biphenyl novolac epoxy resins, and the like.

Among these, the epoxy resin which is liquid or liquefied at a relatively low temperature is preferably used for producing the epoxy resin composition having high adhesion to a substrate. Examples of the liquid epoxy resin include bisphenol A epoxy resins having an average molecular weight of about 400 or less; branched polyfunctional bisphenol A epoxy resins such as p-glycidyloxyphenyl dimethyltrisbisphenol A diglycidyl ether; bisphenol F epoxy resins; resorcin epoxy resins; phenol novolac epoxy resins having an average molecular weight of about 570 or less; alicyclic epoxy resins such as vinyl(3,4-cyclohexyene)dioxide, (3,4-epoxycyclhexyl)methyl 3,4-epoxycyclohexylcarboxylate, bis(3,4-epoxy-6-methylcyclohexylmethyl) adipate, and 2-(3,4-epoxycyclohexyl) 5,1-spiro(3,4-epoxycyclohexyl)-m-dioxane; biphenyl epoxy resins such as 3,3',5,5'-tetramethyl-4,4'-diglycidyloxybiphenyl; glycidyl ester epoxy resins such as diglycidyl hexahydrophthalate, diglycidyl 3-methylhexahydrophthalate, and diglycidyl hexahydroterephthalate; glycidyl amine epoxy resins such as diglycidyl aniline, digycidyl toluidine, triglycidyl-p-aminophenol, tetraglycidyl-m-xylylenediamine, and tetraglycidyl bis (aminomethyl)cyclohexane; hydantoin epoxy resins such as 1,3-diglycidyl-5-methyl-5-ethylhydantoin; naphthalene ring-containing epoxy resins; epoxy resins having a silicone skeleton, such as 1,3-bis(3-glycidoxypropyl)-1,1,3,3-tetramethyl disiloxane; and the like.

In order to allow the epoxy resin composition of the present invention in a liquid or even a solid shape to exhibit high mobility at a low temperature, a liquid compound having an epoxy group, that is, a reactive diluent, may be used, and examples of such compound include monoepoxide compounds such as n-butyl glycidyl ether, 2-ethylhexyl glycidyl ether, phenyl glycidyl ether, cresyl glycidyl ether, p-s-butylphenyl glycidyl ether, styrene oxide, and α-pinene oxide; diepoxide compounds such as (poly)ethylene glycol diglycidyl ether, (poly)propylene glycol diglycidyl ether, butanediol glycidyl ether, and neopenthyl glycol diglycidyl ether; triepoxide compounds such as trimethylol propane triglycidyl ether and glycerin triglycidyl ether; monoepoxide compounds having another functional group, such as allyl glycidyl diether, glycidyl methacrylate, and 1-vinyl-3,4-epoxycyclohexane; and the like. Di- or higher-functional compounds are preferably used in view of the heat resistance physical property of the resultant cured product.

The epoxy resin composition of the present invention is characterized by exhibiting excellent solvent solubility. Therefore, the epoxy resin composition of the present invention may be mixed with an organic solvent. Examples of the organic solvent which can be used include, but are not particularly limited to, methyl ethyl ketone, acetone, dimethylformamide, methyl isobutyl ketone, methoxypropanol, cyclohexanone, methyl cellosolve, ethyl diglycol acetate, propylene glycol monomethyl ether acetate, and the like. The organic solvent and proper amount of the organic solvent used are appropriately selected according to application. For example, in application to an electronic circuit board, a polar solvent having a boiling point of 160° C. or less, such as methyl ethyl ketone, acetone, dimethylformamide, or the like, is preferred, and the solvent is preferably used at such a ratio that the nonvolatile content is 40% to 80% by mass. On the other hand, in application to an adhesive film for build-up, examples of the organic solvent include ketones such as acetone, methyl ethyl ketone, cyclohexanone, and the like; acetate esters such as ethyl acetate, butyl acetate, cellosolve acetate, propylene glycol monomethyl ether acetate, carbitol acetate, and the like; carbitols such as cellosolve, butyl carbitol, and the like; aromatic hydrocarbons such as toluene, xylene, and the like; and amides such as dimethylformamide, dimethylacetamide, N-methylpyrrolidone, and the like. Also, the organic solvent is preferably used at such a ratio that the nonvolatile content is 30% to 60% by mass.

Also, for example, in the field of electronic circuit boards, in order to exhibit flame retardancy, the epoxy resin composition of the present invention may be mixed with a non-halogen flame retardant substantially not containing halogen atoms.

Examples of the non-halogen flame retardant include a phosphorus-based flame retardant, a nitrogen-based flame retardant, a silicone-based flame retardant, an inorganic flame retardant, an organic metal salt-based flame retardant, and the like, and the use thereof is not particularly limited.

These flame retardants may be used alone or in combination of a plurality of same types or different types of flame retardants.

Either an inorganic or organic compound can be used as the phosphorus-based flame retardant. Examples of the inorganic compound include red phosphorus, ammonium phosphates such as monoammonium phosphate, diammonium phosphate, triammonium phosphate, ammonium polyphosphate, and the like; inorganic nitrogen-containing phosphorus compounds such as phosphoric acid amide and the like.

Also, red phosphorus is preferably surface-treated for the purpose of preventing hydrolysis or the like, and examples of a surface treatment method include (i) a method of coating with an inorganic compound such as magnesium hydroxide, aluminum hydroxide, zinc hydroxide, titanium hydroxide, bismuth oxide, bismuth hydroxide, bismuth nitrate, or a mixture thereof, (ii) a method of coating with a mixture of an inorganic compound such as magnesium hydroxide, aluminum hydroxide, zinc hydroxide, or titanium hydroxide, and a thermosetting resin such as a phenol resin or the like; and (iii) a method of double-coating with an inorganic compound such as magnesium hydroxide, aluminum hydroxide, zinc hydroxide, titanium hydroxide, or the like and further coating with a thermosetting resin such as a phenol resin or the like.

Examples of the organic phosphorus-based compound include general-purpose organic phosphorus-based compounds such as phosphoric acid ester compounds, phosphonic acid compounds, phosphinic acid compounds, phosphine oxide compounds, phosphorane compounds, organic nitrogen-containing phosphorus compounds, and the like; cyclic organic phosphorus compounds such as 9,10-dihydroxy-9-oxa-10-phosphaphenanthrene=10-oxide, 10-(2,5-dihydroxyphenyl)-10H-9-oxa-10-phosphaphenanthrene=10-oxide, 10-(2,7-dihydroxynaphthyl)-10H-9-oxa-10-phosphaphenanthrene=10-oxide, and the like; and derivatives produced by reacting the cyclic organic phosphorus compounds with a compound such as an epoxy resin, a phenol resin, or the like.

The amount of the phosphorus-based flame retardant mixed is properly selected according to the type of the phosphorus-based flame retardant, the other components of the curable resin composition, and the desired degree of flame retardancy. For example, when red phosphorus is used as the non-halogen flame retardant, it is preferably mixed within a range of 0.1% to 2.0% by mass relative to the epoxy resin composition containing all of the epoxy resin (A), the filler (B), the curing agent, the other resin, the non-halogen flame retardant, and another filler and additives, and when the organic phosphorus compound is used, it is preferably mixed within a range of 0.1% to 10.0% by mass and particularly preferably within a range of 0.5% to 6.0% by mass, relative to the epoxy resin composition.

When the phosphorus-based flame retardant is used, the phosphorus-based flame retardant may be combined with hydrotalcite, magnesium hydroxide, a boron compound, zirconium oxide, a black dye, calcium carbonate, zeolite, zinc molybdate, activated carbon, or the like.

Examples of the nitrogen-based flame retardant include a triazine compound, a cyanuric acid compound, an isocyanuric acid compound, phenothiazine, and the like, and a triazine compound, a cyanuric acid compound, and an isocyanuric acid compound are preferred.

Examples of the triazine compound include melamine, acetoguanamine, benzoquanamine, melon, melam, succinoguanamine, ethylenedimelamine, melamine polyphosphate, triguanamine, and the like. Other examples include (i) aminotriazine sulfate compounds such as guanylmelamine sulfate, melem sulfate, melam sulfate and the like; (ii) co-condensates of phenols, such as phenol, cresol, xylenol, butylphenol, nonylphenol, or the like, melamines such as melamine, benzoquanamine, acetoguanamine, formguanamine, or the like, and formaldehyde; (iii) mixtures of the co-condensates (ii) and a phenol resin such as phenol-formaldehyde condensate or the like, and (iv) compounds prepared by further modifying the compound (ii) or (iii) with tung oil, isomerized linseed oil, or the like.

Examples of the cyanuric acid compound include cyanuric acid, melamine cyanurate, and the like.

The amount of the nitrogen-based flame retardant mixed is properly selected according to the type of the nitrogen-based flame retardant, the other components of the curable resin composition, and the desired degree of flame retardancy. For example, the nitrogen-based flame retardant is preferably mixed within a range of 0.05% to 10% by mass and particularly preferably within a range of 0.1% to 5% by mass relative to the epoxy resin composition containing all of the epoxy resin, the curing agent, the non-halogen flame retardant, and another filler and additives.

Also, when the nitrogen-based flame retardant is used, it may be combined with a metal hydroxide, a molybdenum compound, or the like.

The silicone-based flame retardant is not particularly limited as long as it is an organic compound containing a silicon atom, and examples thereof include silicone oil, silicone rubber, silicone resin, and the like.

The amount of the silicone-based flame retardant mixed is properly selected according to the type of the silicone-based flame retardant, the other components of the epoxy resin composition, and the desired degree of flame retardancy. For example, the silicone-based flame retardant is preferably mixed within a range of 0.05% to 20% by mass relative to the epoxy resin composition containing all of the epoxy resin composition, the non-halogen flame retardant, and another filler and additives. Also, when the silicone-based flame retardant is used, it may be combined with a molybdenum compound, alumina, or the like.

Examples of the inorganic flame retardant include metal hydroxides, metal oxides, metal carbonate compounds, metal powders, boron compounds, low-melting-point glass, and the like.

Specific examples of the metal hydroxides include aluminum hydroxide, magnesium hydroxide, dolomite, hydrotalcite, calcium hydroxide, barium hydroxide, zirconium hydroxide, and the like.

Specific examples of the metal oxides include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, tungsten oxide, and the like.

Specific examples of the metal carbonate compounds include zinc carbonate, magnesium carbonate, calcium carbonate, barium carbonate, basic magnesium carbonate, aluminum carbonate, iron carbonate, cobalt carbonate, titanium carbonate, and the like.

Specific examples of the metal powders include powders of aluminum, iron, titanium, manganese, zinc, molybdenum, cobalt, bismuth, chromium, nickel, copper, tungsten, tin, and the like.

Specific examples of the boron compounds include zinc borate, zinc metaborate, barium metaborate, boric acid, borax, and the like.

Specific examples of the low-melting-point glass include glassy compounds such as CEEPREE (Bokusui Brown Co., Ltd.), hydrate glass $SiO_2$—MgO—$H_2O$, PbO—$B_2O_3$—, ZnO—$P_2O_5$—MgO—, $P_2O_5$—$B_2O_3$—PbO—MgO—, P—Sn—O—F—, PbO—$V_2O_5$—$TeO_2$—, and $Al_2O_3$—$H_2O$-based and lead borosilicate-based glass.

The amount of the inorganic flame retardant mixed is properly selected according to the type of the inorganic flame retardant, the other components of the epoxy resin composition, and the desired degree of flame retardancy. For example, the inorganic flame retardant is preferably mixed within a range of 0.5% to 50% by mass and particularly preferably in a range of 5% to 30% by mass relative to the curable resin composition containing all of the epoxy resin composition, the non-halogen flame retardant, and another filler and additives.

Examples of the organic metal salt-based flame retardant include ferrocene, acetylacetonate metal complexes, organic metal carbonyl compounds, organic cobalt salt compounds, organic sulfonic acid metal salts, compounds each having ionic bond or coordinate bond between a metal atom and an aromatic compound or a heterocyclic compound, and the like.

The amount of the organic metal salt-based flame retardant mixed is properly selected according to the type of the organic metal salt-based flame retardant, the other components of the epoxy resin composition, and the desired degree of flame retardancy. For example, the organic metal salt-based flame retardant is preferably mixed within a range of 0.005% to 10% by mass relative to the epoxy resin composition containing all of the epoxy resin composition, the non-halogen flame retardant, and another filler and additives.

The epoxy resin composition of the present invention, if required, may contain other compounds, and an external lubricant, an internal lubricant, an antioxidant, an optical stabilizer, an ultraviolet absorber, various colorants, etc. may be added within a range in which the effect of the present invention is not impaired. In addition, silicone oil, liquid rubber, rubber powder, or a stress reducing agent (stress relaxing agent) such as a thermoplastic resin, such as butadiene-based copolymer rubber, for example, a methyl acrylate-butadiene-styrene copolymer, a methyl methacrylate-butadiene-styrene copolymer, or the like, a silicone compound, or the like, can be used for regulating adhesion.

The epoxy resin composition of the present invention can be produced by mixing 2,2',7,7'-tetraglycidyloxy-1,1'-binaphthalene as the epoxy resin (A), the filler (B), and, if required, the curing agent and other compounds. The mixing method is not particularly limited, and a known common method is used for mixing. A general method includes sufficiently mixing predetermined amounts of raw materials using a mixer or the like and then kneading the resultant mixture using a three-roll or the like to form a liquid composition having mobility, or includes sufficiently mixing predetermined amounts of raw materials using a mixer or the like, melt-kneading the resultant mixture using a mixing roll, an extruder, or the like, and then cooling and grinding the kneaded product to form a solid composition. The mixing may be performed under a condition in which the epoxy compound and the curing agent are sufficiently uniformly mixed, but the filler is also more preferably dispersed and mixed.

In addition, when the fibrous base material is a sheet or assembly such as a woven fabric or nonwoven fabric, the composition other than the sheet or assembly as the fibrous base material can be mixed, complicated by a method such as impregnation, coating, spray coating, injection, or the like, and then cured.

The epoxy resin composition of the present invention has excellent heat resistance and can be preferably used as a heat dissipation material and an electronic material according to the filer (B) used.

[Thermally Conductive Adhesive]

For example, when the epoxy resin composition is used as a thermally conductive adhesive, it is used for exhibiting good heat dissipation by bonding a portion of an electric/electronic apparatus, such as a power module, in which heat is desired to be dissipated, to a heat dissipation member (for example, a metal plate or heat sink). In this case, the shape of the thermally conductive composition used is not particularly limited, but when the thermally conductive composition is designed in a liquid or paste shape, the liquid or paste-shaped thermally conductive composition may be injected at an interface between bonded surfaces and then cured after bonding. When the thermally conductive composition is designed in a solid shape, the powder, chip, or sheet-shaped thermally conductive composition may be placed at an interface between bonded surfaces and then cured after bonding by heat melting.

When the epoxy resin composition is used as an electronic material, it can be preferably used as a semiconductor encapsulating material and a material for an electronic circuit board.

[Semiconductor Encapsulating Material]

For example, in order to produce the epoxy resin composition for electronic materials, which is used as the semiconductor encapsulating material, the melt-mixing type epoxy resin composition may be produced by sufficiently mixing the 2,2',7,7'-tetraglycidyloxy-1,1'-binaphthalene and the curing agent using, for example, an extruder, a kneader, a roll, or the like, until the resultant mixture becomes uniform. In this case, usual silica is used as the filler (B), and the filler is used at a filling rate within a range of 30% to 95% by mass relative to 100 parts by mass of the epoxy resin composition. In particular, in order to attempt to improve flame retardancy, moisture resistance, and solder crack resistance and decrease a coefficient of linear expansion, the filling rate is preferably 65% by mass or more and particularly preferably 70% by mass or more, and in order to significantly increase the effect, a filling rate of 80% by mass or more can further enhance the effect.

In a semiconductor package molding method, the composition is molded by casting or molding using a transfer molding machine, an injection molding machine, or the like, and further heated at 50° C. to 200° C. for 2 to 10 hours to produce a semiconductor device as a molded product.

The epoxy resin composition for electronic materials of the present invention, which is used as the semiconductor encapsulating material, if required, may use a coupling agent for enhancing adhesion between the resin component and the filler (B). Examples of the coupling agent include various silane-based compounds such as epoxysilane, mercaptosilane, aminosilane, alkylsilane, ureidosilane, vinylsilane, and the like; titanium-based compounds, aluminum-based compounds, zirconium-based compounds, aluminum chelates, and the like.

The amount of the coupling agent mixed is preferably 0.01% to 5% by mass and more preferably 0.05% to 2.5% by mass relative to the filler (B). With the amount of less than 0.01% by mass, adhesion to various package constituent members tends to decrease, while with the amount exceeding 5% by mass, molding defects such as voids tend to easily occur.

The epoxy resin composition for electronic materials of the present invention, which is used as the semiconductor encapsulating material, if required, can be further mixed with a mold release agent, a colorant, a stress relaxing agent, an adhesion improver, a surfactant, etc. as additives.

Examples of the mold release agent include carnauba wax, hydrocarbon-based, aliphatic, amide-based, ester-based, higher alcohol-based, and higher fatty acid metal salt-based mold release agents, and the like.

Examples of the hydrocarbon-based mold release agent include paraffin wax, polyolefin-based wax, and the like. The polyolefin-based wax is roughly divided into unoxidized nonpolar polyolefin wax and oxidized polyolefin wax, and examples of each of the waxes include polyethylene-based, polypropylene-based, and vinyl acetate-ethylene copolymer-based waxes.

Examples of the fatty acid-based mold release include montanic acid, stearic acid, hebenic acid, and 12-hydroxystearic acid; examples of the amide-based mold release agent include stearic amide, oleic amide, and methylene bisstearic amide; examples of the ester-based mold release agent include butyl stearate, monoglyceride stearate, and stearyl stearate; examples of the higher alcohol-based mold release agent include stearyl alcohol; and examples of the higher fatty acid metal salts include calcium stearate, zinc stearate, magnesium stearate, and the like.

Any one of inorganic colorants such as red iron oxide, carbon black, a glass composition, and the like; phthalocyanine-based compounds; and anthraquinone-based, methine-based, indigoid-based, and azo-based organic compound dyes can be used as the colorant, but carbon black is preferred because of the excellent coloring effect.

Examples of the stress reducing agent (stress relaxing agent) include, but are not particularly limited to, butadiene-based copolymer rubber, such as methyl acrylate-butadiene-styrene copolymer and methyl methacrylate-butadiene-styrene copolymer, and silicone compounds, such as silicone oil, liquid rubber, rubber powder, thermoplastic resins, and the like.

Further, an ion trapping agent such as hydrotalcite, bismuth oxide, or the like may be mixed for the purpose of improving reliability in a moisture-resistance reliability test. Examples of the adhesion improver include, but are not particularly limited to, N-cyclohexyl-2-benzothiazolyl sulfonamide, N-oxydiethylene-2-benzothiazolyl sulfonamide, N,N-dicyclohexyl-2-benzothiazolyl sulfonamide, N-tert-butyl-2-benzothiazolyl sulfonamide, compounds having a benzothiazole skeleton, indene resins, cross-linked diallyl phthalate resin powder, butadiene-based rubber particles, and the like.

Examples of the surfactant include polyethylene glycol fatty acid esters, sorbitan fatty acid esters, fatty acid monoglyceride, and the like.

The epoxy resin composition for electronic materials of the present invention, which is used as the semiconductor encapsulating material, can be prepared by using any desired method as long as various raw materials can be uniformly dispersed and mixed. A general method is, for example, a method in which predetermined amounts of raw materials are sufficiently mixed by using a mixer or the like, melt-kneaded by a mixing roll, an extruder, or the like, cooled, and then ground. Tablets having dimensions and mass matching with molding conditions can be easily used.

An electronic component device provided with an element encapsulated with the epoxy resin composition for electronic materials, which is used as a semiconductor encapsulating material and produced in the present invention, is an electronic component device produced by mounting elements such as an active element, such as a semiconductor chip, a transistor, a diode, a thyristor, or the like, and a passive element, such as a capacitor, a resistor, a coil, or the like, on a support member such as a lead frame, a prewired tape carrier, a circuit plate, a glass, a silicon wafer, or the like, and sealing a required portion with the semiconductor encapsulating material of the present invention. Specific examples of the electronic component device include 1) general resin-sealed IC such as DIP, PLCC, QFP, SOP, SOJ, TSOP, TQFP, or the like, which is produced by fixing a semiconductor device on a lead frame, connecting a device terminal portion, such as a bonding pad, to a lead portion by wire bonding or bumps, and then sealing by transfer molding or the like using the semiconductor encapsulating material of the present invention; 2) TCP produced by sealing a semiconductor chip connected to a tape carrier using bumps with the semiconductor encapsulating material of the present invention, and a semiconductor chip connected to wiring formed on a circuit plate or a glass by wire bonding, flip-chip bonding, soldering, or the like; 3) a COB module produced by sealing an active element, such as a semiconductor chip, a transistor, a diode, a thyristor, or the like, or a passive element, such as a capacitor, a resistor, a coil, or the like, with the semiconductor encapsulating material of the present invention; and 4) a single-side sealed package, such as BGA, CSP, MCP, or the like, which is produced by mounting a semiconductor chip on an interposer substrate on which hybrid IC, multi-chip module, and a terminal for mother board connection have been formed, connecting the semiconductor chip to wiring formed on the interposer substrate by bumps or wire bonding, and then sealing the semiconductor chip-mounted side with the semiconductor encapsulating material of the present invention. Among these devices, the singe-side sealed package having a device sealed with the epoxy resin composition for electronic materials, which is used as the semiconductor encapsulating material and produced in the present invention, is characterized by having a small amount of curvature.

A copper (including a copper alloy) lead frame, a Ni-plated lead frame having a Ni layer formed on a surface of a copper plate or the like by a method of plating or the like, an a lead frame made of 42 alloy can be used as the lead frame.

The most general method for sealing a device with the epoxy resin composition for electronic materials of the present invention, which is used as the semiconductor encapsulating material, is a low-pressure transfer molding method, but an injection molding method, a compression molding method, or the like may be used.

[Electron Circuit Board]

The epoxy resin composition for electronic materials of the present invention, which is used for an electronic circuit board, is specifically used for a printed circuit board material, a flexible circuit board material, an interlayer insulating material for a build-up substrate, a conductive paste, an adhesive film material for build-up, a resist ink, a resin casting material, an adhesive, etc. Among these applications, in applications to the printed circuit board, the flexible circuit board material, the interlayer insulating material for a build-up substrate, and the adhesive film for build-up, the epoxy resin composition can be used as an insulating material for a so-called substrate for built-in electronic components, in which a passive component such as a capacitor or the like and an active component such as a IC chip or the like are embedded. In particular, the epoxy resin composition is preferably used as a resin composition for the flexible circuit board and the interlayer insulating material for a build-up substrate in view of the characteristics such as high flame retardancy, high heat resistance, low thermal expansibility, and solvent solubility.

By using the epoxy resin composition for electronic materials of the present invention, a printed circuit board can be produced by, for example, a method including adding and mixing an organic solvent to and with the epoxy resin composition for electronic materials to prepare a varnish of the epoxy resin composition, impregnating a reinforcing base material with the varnish, and then laminating a copper foil and pressure-heat bonding the copper foil. Examples of the reinforcing base material which can be used include paper, a glass cloth, a glass nonwoven fabric, aramid paper, an aramid cloth, a glass mat, a glass roving cloth, and the like. In further detail, the method includes heating the varnish-like curable resin composition described above at a heating temperature according to the type of the solvent used, preferably at 50° C. to 170° C., to prepare a prepreg as a cured product. The mass ratio between the resin composition and the reinforcing base material used is not particularly limited but is generally preferably adjusted so that the resin content in the prepreg is 20% to 60% by mass. Next, the prepregs prepared as described above are properly stacked by a usual method, and a copper foil is laminated and heat-pressure-bonded at 170° C. to 250° C. for 10 minutes to 3 hours under a pressure of 1 to 10 MPa, thereby producing a target printed circuit board.

In producing a flexible circuit board using the epoxy resin composition for electronic materials of the present invention, besides the epoxy resin composition for electronic materials, a phosphorus atom-containing compound, a curing accelerator, and an organic solvent are mixed and applied to an electric insulating film by using an applicator such as a reverse roll coater, a comma coater, or the like. Next, the solvent is evaporated by heating at 60° C. to 170° C. for 1 to 15 minutes using a heater, thereby forming a B-stage adhesive composition. Next, a metal foil is heat-pressure-bonded to the adhesive by using a heating roll or the like. The bonding pressure is preferably 2 to 200 N/cm, and the bonding temperature is preferably 40° C. to 200° C. When satisfactory bonding performance is obtained, the process may be finished, while when complete curing is required, post-curing is preferably further performed under the conditions of 100° C. to 200° C. for 1 to 24 hours. The thickness of the adhesive composition film after final curing is preferably within a range of 5 to 100 μm.

An example of a method for producing an interlayer insulating material for a build-up substrate by using the epoxy resin composition for electronic materials of the present invention includes properly adding rubber, a filler, or the like to the epoxy resin composition for electronic materials, applying the resultant mixture to a circuit board, on which a circuit has been formed, by a spray coating method, a curtain coating method, or the like, and then curing the resin composition. Then, if required, holes such as predetermined through holes are formed, and then the surface is treated with a roughening agent and washed with hot water to form irregularity, followed by plating with a metal such as copper or the like. The plating method is preferably electroless plating, electroplating, or the like, and an oxidizer, an alkali, an organic solvent, or the like can be used as the roughening agent. This operation is successively repeated according to demand to alternately build-up a resin insulating layer and a conductor layer having a predetermined circuit, and consequently a build-up substrate can be produced. However, the through holes are formed after the outermost resin insulating layer is formed. Also, a build-up substrate can be produced, without the step of forming a roughened surface and plating, by heat-pressure-bonding at 170° C. to 250° C. a copper foil with a resin, which is formed by semi-cuing the resin composition on the copper foil, to a circuit substrate having a circuit formed thereon.

An example of a method for producing an adhesive film for build-up using the epoxy resin composition for electronic materials of the present invention is a method in which an organic solvent is added to the epoxy resin composition for electronic materials to prepare a varnish of the epoxy resin composition, and the vanish is applied to a support film to form a resin composition layer, thereby forming an adhesive film for a multilayered printed circuit board.

When the epoxy resin composition for electronic materials of the present invention is used for the adhesive film for build-up, it is necessary for the adhesive film to soften under a lamination temperature condition (generally 70° C. to 140° C.) in a vacuum lamination method and exhibit mobility (resin flow) enabling resin filling in via holes or through holes present in a circuit board at the same time as lamination on the circuit board. The components described above are preferably mixed so as to exhibit these characteristics.

The through holes of the multilayered printed circuit board generally have a diameter of 0.1 to 0.5 mm and a depth of 0.1 to 1.2 mm, and in general, filling of the resin can be preferably performed within this range. When both sides of the circuit board are laminated, the through holes are preferably about ½ filled.

Specifically, the adhesive film can be produced by a method including preparing a varnish of the epoxy resin composition for electronic materials, applying the varnish-like epoxy resin composition on a surface of a support film, and further drying the organic solvent by heating or hot air spraying to form a layer of the epoxy resin composition.

The thickness of the formed layer is generally equal to or larger than the thickness of a conductor layer. Since the thickness of the conductor layer possessed by the circuit board is generally within a range of 5 to 70 μm, the thickness of the resin composition layer is preferably 10 to 100 μm.

In addition, the layer may be protected by a protective film described below. By protecting by the protective film, dust adhesion and flaws on the surface of the resin composition layer can be prevented.

Examples of the support film and the protective film include films of polyolefins such as polyethylene, polypropylene, polyvinyl chloride, and the like, polyesters such as polyethylene terephthalate (may be abbreviated as "PET" hereinafter), polyethylene naphthalate, and the like, polycarbonate, and polyimide; release paper; metal foils such as a copper foil, an aluminum foil, and the like. The support film and the protective film may be subjected treatment such as MAD treatment, corona treatment, or mold release treatment.

The thickness of the support film is not particularly limited but is generally within a range of 10 to 150 μm and preferably 25 to 50 μm. The thickness of the protective film is preferably 1 to 40 μm.

The support film is separated after laminated on the circuit board or after an insulating layer is formed by heat curing. When the support film is separated after the adhesive film is heat-cured, adhesion of dust or the like can be prevented in the curing step. When separated after curing, the support film is generally previously subjected to mold release treatment.

Next, by using the adhesive film formed as described above, the multilayered printed circuit board is produced by a method in which for example, when the layer is protected by the protective film, the protective film is separated, and then the layer is laminated on one or both of the sides of the circuit board by, for example, a vacuum lamination method so that the layer is in direct contact with the circuit board. The lamination method may be either a batch method or a continuous method using a roll. In addition, the adhesive film and the circuit board, if required, may be heated (pre-heated) before lamination.

The lamination conditions preferably include a pressure-bonding temperature (lamination temperature) of 70° C. to 140° C. and a pressure-bonding pressure of 1 to 11 kgf/cm$^2$ ($9.8 \times 10^4$ to $107.9 \times 10^4$ N/m2), and lamination is preferably performed under reduced pressure at an air pressure of 20 mmHg (26.7 hPa) or less.

[Other Electronic Material Application]

The epoxy resin composition for electronic materials of the present invention can used as a conductive paste. Examples of a method include a method in which a composition for an anisotropic conductive film is prepared by dispersing fine conductive particles in the curable resin composition and a method in which a paste resin composition for circuit connection or anisotropic conductive adhesive which is liquid at room temperature is prepared.

When the epoxy resin composition for electronic materials of the present invention is used as a resist ink, for example, a method can be used, in which a cationic polymerization catalyst is used as a catalyst for the epoxy resin composition, a pigment, talc, and a filler are further added to the epoxy resin composition to prepare a composition for a resist ink, and then the composition is applied to a printed board by a screen printing method and cured to form a resist ink cured product.

EXAMPLES

The present invention is specifically described with reference to examples and comparative examples In addition, melt viscosity at 150° C., GPC and MS spectrum were measured under conditions below.

1) Melt viscosity at 150° C.: according to ASTM D4287
2) Softening point measuring method: JIS K7234
3) GPC: Measurement conditions are as follows.
   Measuring apparatus: "HLC-8220 GPC" manufactured by Tosoh Corporation
   Column: guard column "HXL-L" manufactured by Tosoh Corporation
   +"TSK-GEL G2000HXL" manufactured by Tosoh Corporation
   +"TSK-GEL G2000HXL" manufactured by Tosoh Corporation
   +"TSK-GEL G3000HXL" manufactured by Tosoh Corporation
   +"TSK-GEL G4000HXL" manufactured by Tosoh Corporation
   Detector: RI (Refractive Index Detector)
   Data processing: "GPC-8020 model II version 4.10" manufactured by Tosoh Corporation
   Measurement condition: Column temperature 40° C.
   Moving phase: tetrahydrofuran
   Flow rate: 1.0 ml/min
   Standard: using monodisperse polystyrene below having a known molecular weight according to a measurement manual of "GPC-8020 model II version 4.10" described above.

(Polystyrene Used)
   "A-500" manufactured by Tosoh Corporation
   "A-1000" manufactured by Tosoh Corporation
   "A-2500" manufactured by Tosoh Corporation
   "A-5000" manufactured by Tosoh Corporation
   "F-1" manufactured by Tosoh Corporation
   "F-2" manufactured by Tosoh Corporation
   "F-4" manufactured by Tosoh Corporation
   "F-10" manufactured by Tosoh Corporation
   "F-20" manufactured by Tosoh Corporation
   "F-40" manufactured by Tosoh Corporation
   "F-80" manufactured by Tosoh Corporation
   "F-128" manufactured by Tosoh Corporation
   Sample: prepared by filtering with a microfilter a 1.0 mass % tetrahydrofuran solution in terms of resin solid content (50 μl).

4) NMR: NMR LA300 manufactured by JEOL Ltd.
5) MS: gas chromatography-time-of-flight mass spectrometer JMS-T100GC manufactured by JEOL Ltd.

Synthesis Example 1

In a flask provided with a thermometer, a stirrer, and a reflux condenser, 139 g (0.5 mole) of iron(III) chloride hexahydrate and 1330 mL of water were charged under nitrogen gas purging, the inside of the reactor was replaced with nitrogen under stirring, and then a solution prepared by dissolving 82 g (0.5 mole) of naphthalene-2,7-dool in 190 mL of isopropyl alcohol was added to the resultant mixture and stirred at 40° C. for 30 minutes. Then, a mixed solution of 139 g (0.5 mole) of iron(III) chloride hexahydrate, 664 mL of water, and 94 mL of isopropyl alcohol was added and heated to 40° C., followed by further stirring for 1 hour. Then, 500 mL of ethyl acetate was added to the reaction solution and stirred for 10 minutes. The reaction solution transferred to a separating funnel, an organic layer was separated, and then further an aqueous layer was extracted with ethyl acetate. The combined organic layer was washed with saturated brine. The solvent was distilled off to leave about 200 mL under vacuum, and then the solution was transferred to a SUS vessel provided with a thermometer, a stirrer, and a Dean-Stark trap, 5 L of toluene was added, and then ethyl acetate and water as the solvent were replaced by toluene. The toluene solution was cooled to room temperature, and then an insoluble substance was filtered off. The filtrate was transferred to a SUS vessel provided with a thermometer, a stirrer, and a Dean-Stark trap, and then concentrated by distilling off toluene to leave about 500 mL by heating to a temperature equal to or higher than the boiling point under stirring, thereby precipitating a crystal of 1,1'-binaphthalene-2,2',7,7'-tetraol. The precipitate and the solvent were filtered by hot filtration at a temperature of 80° C. or more, and then the residue was dried at 110° C. for 5 hours to produce 1,1'-binaphthalene-2,2',7,7'-tetraol in a yield of 53 g (yield 68%). It was confirmed by GPC and MS that the resultant 1,1'-binaphthalene-2,2',7,7'-tetraol has high purity without containing multimerized components.

Synthesis Example 2

In a flask provided with a thermometer, a dropping funnel, a condenser, and a stirrer, 79.5 g (0.25 moles) of 1,1'-binaphthalene-2,2',7,7'-tetraol produced in Synthesis Example 1, 462 g (5.0 moles) of epichlorohydrin, and 126 g of n-butanol were charged and dissolved under nitrogen gas purging. The resultant solution was heated to 40° C., and then 100 g (1.20 moles) of a 48% aqueous sodium hydroxide solution was added over 8 hours, and the resultant mixture was further heated to 50° C., followed by further reaction for 1 hour. After the completion of reaction, 150 g of water was added, and a lower layer was discarded after still standing. Then, unreacted epichlorohydrin was distilled off at 150° C. under reduced pressure. The resultant crude epoxy resin was dissolved in 230 g of methyl ethyl isobutyl ketone added thereto. Further, 100 g of a 10 mass % aqueous sodium hydroxide solution was added to the resultant solution, reaction was performed at 80° C. for 2 hours, and then water washing was repeated 3 times until a washing solution became neutral pH. Next, the inside of the reaction system was dehydrated by azeotropy and then subjected to microfiltration, and then the solvent was distilled off under reduced pressure to produce 135 g of 2,2',7,7'-tetraglycidyloxy-1,1'-binaphthalene (A-1) as a target epoxy resin. The resultant epoxy resin (A-1) had a softening point of 61° C. (B&R method), a melt viscosity (measurement method: ICI viscometer method, measurement temperature: 150° C.) of 1.1 dPa·s, and an epoxy equivalent of 144 g/equivalent. The content of the target product was 90% or more in terms of area ratio in GPC measurement, and a peak at 542 showing 2,2',7,7'-tetraglycidyloxy-1,1'-binaphthalene (A-1) was confirmed by MS measurement.

Reference Example 1 and Reference Example 2

Each of the epoxy resin (A-1) of the present invention produced in Synthesis Example 2 and comparative epoxy resin (A-2) represented by [structural formula below]

[Chem. 3]

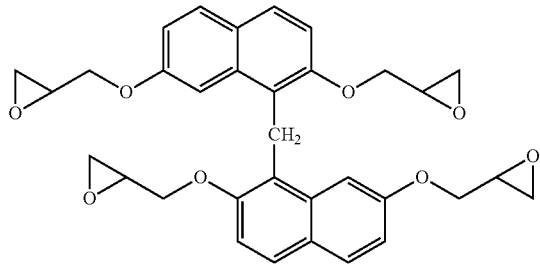

which was a tetrafunctional naphthalene-based epoxy resin ("Epiclon HP-4700" manufactured by DIC Corporation, softening point: 91° C., melt viscosity at 150° C.: 4.5 ps, epoxy equivalent: 166 g/equivalent)],
a phenol novolac phenol resin ("Phenolite TD-2131" manufactured by DIC Corporation, hydroxyl equivalent: 104 g/equivalent) as a curing agent, and triphenylphosphine (TPP) as a curing accelerator were mixed to have a composition shown in Table 1, and the mixture was poured into a mold frame of 11 cm×9 cm×2.4 mm and molded at a temperature of 150° C. for 10 minutes by using a press, and then a molded product was removed from the mold frame. Then, the molded product was cured at a temperature of 175° C. for 5 hours to form a cured product, which was then evaluated for heat resistance, coefficient of linear thermal expansion, and moisture absorption. Also, solvent solubility of each of the epoxy resin (A-1) and the epoxy resin (A-2) was measured by a method described below. The results are shown in Table 1.

<Heat Resistance (Glass Transition Temperature)>

A temperature at which a change in elastic modulus was maximized (the highest rate of change in tan δ) was evaluated as the glass transition temperature by using a viscoelasticity measuring apparatus (DMA: Rheometrics Inc., solid viscoelasticity measuring apparatus RSA II, rectangular tension method: frequency 1 Hz, heating rate 3° C./min).

<Heat Resistance (Thermal Decomposition Temperature at 5% Weight Loss)

A resin coating film was weighed in an aluminum pan vessel and heated from room temperature to 500° C. to measure a thermal decomposition temperature at 5% weight loss by using a simultaneous thermogravity-differential scanning calorimetry measuring apparatus (TG/DTA6200 manufactured by SII Nanotechnology Inc.)

Measurement Conditions
Measurement temperature; room temperature to 500° C.
Measurement atmosphere: nitrogen
Heating rate: 10° C./min <Coefficient of Linear Thermal Expansion>

Thermomechanical analysis was performed in a compression mode by using a thermomechanical analyzer (TMA: SS-6100 manufactured by Seiko Instruments Inc.).

Measurement Conditions
Measurement load; 88.8 mN
Heating rate: two times at 3° C./min
Measurement temperature range: −50° C. to 300° C.
Measurement was performed two times for a same sample under the conditions described above, and a mean coefficient of expansion within a temperature range of 25° C. to 280° C. in the second measurement was evaluated as a coefficient of linear thermal expansion.

<Moisture Absorptivity>

A moisture absorptivity was calculated from a rate of weight increase after moisture absorption for 300 hours in a constant-temperature constant-humidity apparatus under moisture absorption conditions of 85° C. and 85% RH.

<Solvent Solubility>

In a sample bottle, 10 parts of epoxy resin was dissolved in 4.3 parts of methyl ethyl ketone in a closed state at 60° C. Then, the solution was cooled to 25° C., and whether or not crystals were precipitated was evaluated. When crystals were not precipitated, solvent solubility was determined as "Good", and when crystals were precipitated, solvent solubility was determined as "Poor".

TABLE 1

|  |  | Reference Example 1 | Reference Example 2 |
|---|---|---|---|
| Epoxy resin | A-1 | 46.5 |  |
|  | A-2 |  | 49.2 |
| Curing agent | TD-2131 | 33.5 | 30.8 |
| TPP |  | 0.8 | 0.8 |
| Softening point of epoxy resin (° C.) |  | 61 | 91 |
| Melt viscosity at 150° C. of epoxy resin (° C.) |  | 1.1 | 4.5 |
| Tg (DMA) |  | 248 | 237 |
| thermal decomposition temperature at 5% weight loss (° C.) |  | 387 | 378 |
| Coefficient of linear thermal expansion (ppm) |  | 84 | 87 |
| Moisture absorptivity |  | 2.1 | 2.2 |
| Solvent solubility |  | Good | Poor |

Example 1 and Comparative Example 1

Each of the epoxy resin (A-1) of the present invention produced in Synthesis Example 2 and the comparative epoxy resin (A-2) used in Reference Example 2 which was a tetrafunctional naphthalene-based epoxy resin ("Epiclon HP-4700" manufactured by DIC Corporation, softening point: 82° C., melt viscosity at 150° C.: 4.5 ps, epoxy equivalent: 166 g/equivalent)], "XLC-3L" manufactured by Mitsui Chemicals, Inc. (phenol aralkyl resin, hydroxyl equivalent: 172 g/eq) as a curing agent, triphenylphosphine (TPP) as a curing accelerator, spherical silica (FB-560 manufactured by Denki Kagaku Kogyo K. K.) as an inorganic filler, γ-glycidoxytriethoxysilane ("KBM-403" manufactured by Shin-Etsu Chemical Co., Ltd.) as a silane coupling agent, and carnauba wax (PEARL WAX No. 1-P manufactured by Cerarika Noda Co., Ltd.) were used and mixed to have a composition shown in Table 2, and melt-kneaded at a temperature of 90° C. for 5 minutes by using two rolls to prepare a target composition. The resultant composition was ground, molded into a rectangle of 12.7 mm in width, 127 mm in length, and 1.6 mm in thickness by using a transfer molding machine, and further cured at 180° C. for 5 hours.

<Heat Resistance (5%-Weight-Reduction Temperature)

A cured product was formed by using the composition of each of Example 1 and Comparative Example 1, without containing the spherical silica, the silane coupling agent, and the carnauba wax, and evaluated by the same method as in Reference Example 1 and Reference Example 2.

<Flame Retardancy>

A combustion test was performed by using five test pieces for evaluation of 12.7 mm in width, 127 mm in length, and 1.6 mm in thickness according to the UL-94 test method.

Fmax: maximum burning time in one time of flame contacting (sec)

ΣF: total burning time of five test pieces (sec)

TABLE 2

|  |  | Example 1 | Comparative Example 1 |
|---|---|---|---|
| Epoxy resin (A) | A-1 | 36.5 |  |
|  | A-2 |  | 39.5 |
| Curing agent | XLC-3L | 43.5 | 40.7 |
| Filler (B) spherical silica "FB-560" |  | 738 | 738 |
| Silane coupling agent "KBM-403" |  | 0.8 | 0.8 |
| Carnauba wax "REARL WAX No. 1-P" |  | 1.2 | 1.2 |
| TPP |  | 0.8 | 0.8 |
| thermal decomposition temperature at 5% weight loss (° C.) |  | 387 | 377 |
| Flame retardancy | Fmax | 5 | 11 |
|  | ΣF | 10 | 65 |

Example 2

First, 10 g of the epoxy resin (A-1) of the present invention produced in Synthesis Example 2, 4.2 g of AC-9500-SCX (manufactured by Admatechs Co. Ltd., aluminum oxide powder having an average particle diameter of 10 μm and surface-treated with N-phenyl-γ-aminopropyl trimethoxysilane), 2.8 g of AC-2500-SXQ (manufactured by Admatechs Co. Ltd., aluminum oxide powder having an average particle diameter of 0.6 μm and surface-treated with N-phenyl-γ-aminopropyl trimethoxysilane), 10.5 g of MHAC-P (manufactured by Hitachi Chemical Co, Ltd., methyl-3,6-end-methylene-1,2,3,6-tetrahydrophthalic anhydride, molecular weight 178), and 0.1 g of Curesol 2P4MHZ-PW (manufactured by Shikoku Chemicals Corporation, 2-phenyl-4-methyl-5-hydroxymethyl imidazole) were mixed and kneaded by using three rolls to prepare a resin composition. By using the resultant resin composition, a plate-shaped test piece of 60×110×0.8 mm was formed (temporarily curing conditions of 170° C. and 20 minutes, main curing conditions of 170° C. and 2 hours and 250° C. and 8 hours). A test piece of 10×40 mm was cut out from the plate-shaped test piece and placed in a dryer kept at 250° C. As a result of evaluation of heat resistance, 90% or more of the weight was maintained even after 240 hours, and thus high heat resistance was exhibited. Further, the glass transition temperature was 285° C.

Example 3

First, 8 g of the epoxy resin (A-1) of the present invention produced in Synthesis Example 2, 4.3 g of AC-9500-SCX, 2.8 g of AC-2500-SXQ, 10.8 g of MHAC-P, 2 g of SR-16HL (manufactured by Sakamoto Yakuhin Kogyo Co., Ltd., 1,6-hexanediol diglycidyl ether, epoxy equivalent 125), and 0.1 g of Curesol 2P4MHZ-PW were mixed and kneaded by using three rolls to prepare a resin composition. By using the resultant resin composition, a plate-shaped test piece was formed by the same method as in Example 1, and then a test piece of 10×40 mm was cut out from the plate-shaped test piece and evaluated with respect to heat resistance. As a result, 90% or more of the weight was maintained even after 240 hours, and thus high heat resistance was exhibited. Further, the glass transition temperature was 280° C.

Example 4

First, 20 g of the epoxy resin (A-1) of the present invention produced in Synthesis Example 2, 4.3 g of AC-9500-SCX, 2.9 g of AC-2500-SXQ, and 1.0 g of Curesol 2P4MHZ-PW were mixed and kneaded at a temperature at which the mixture was melted by using three rolls to prepare a resin composition. By using the resultant resin composition, a plate-shaped test piece was formed by the same method as in Example 1, and then a test piece of 10×40 mm was cut out from the plate-shaped test piece and evaluated with respect to heat resistance. As a result, 90% or more of the weight was maintained even after 240 hours, and thus high heat resistance was exhibited. Further, the glass transition temperature was 295° C.

Example 5

A resin composition and a cured product were formed and then evaluated by the same methods as in Example 2 using a composition shown in Table 3. The evaluation results are summarized in Table 3.

Examples 6 and 7

A resin composition and a cured product were formed and then evaluated by the same methods as in Example 2 using a composition shown in Table 4. The evaluation results are summarized in Table 4.

Comparative Example 2 Epoxy Resin (A-2)

[Chem. 4]

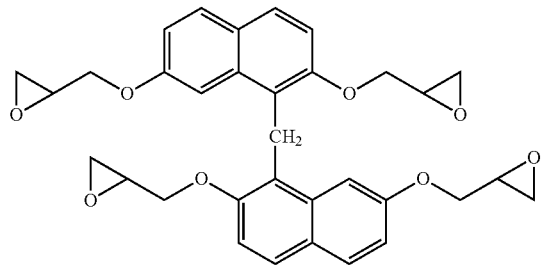

Epiclon HP-4710 represented by the structural formula described above (a tetrafunctional naphthalene-based epoxy resin manufactured by DIC Corporation, softening point: 95°, melt viscosity at 150° C.: 9 dPa·s, epoxy equivalent: 170 g/equivalent) was used as epoxy resin (A-2). First, 4.0 g of the epoxy resin (A-2), 4.3 g of AC-9500-SCX, 2.9 g of AC-2500-SXQ, 11.1 g of MHAC-P, 6.0 g of SR-16HL (manufactured by Sakamoto Yakuhin Kogyo Co., Ltd., trimethylolpropane polyglycidyl ether, epoxy equivalent 137), and 0.1 g of Curesol 2P4MHZ-PW were mixed and kneaded by using three rolls to prepare a resin composition. By using the resultant resin composition, a plate-shaped test piece was formed by the same method as in Example 1, and then a test piece of 10×40 mm was cut out from the plate-shaped test piece and evaluated with respect to heat resistance. As a result, the weight was decreased to 90% after 120 hours, and further the weight was decreased to 90% or less after 240 hours.

Comparative Example 3

First, 20 g of the epoxy resin (A-2), 4.3 g of AC-9500-SCX, 2.9 g of AC-2500-SXQ, and 1.0 g of Curesol 2P4MHZ-PW were mixed and kneaded at a temperature at which the composition was melted by using three rolls to prepare a resin composition. However, the resin composition was not prepared due to gelling during kneading.

Comparative Example 4

A resin composition and a cured product were formed and then evaluated by the same methods as in Example 2 using a composition shown in Table 4. The evaluation results are summarized in Table 4.

<Evaluation>
<Heat Resistance (Weight Retention (%))>
A test piece of 10×40×0.8 mm cut out from a plate-shaped test piece formed by curing the resultant thermally conductive composition was maintained in a dryer kept at 250° C. and the weight of the test piece taken out every hour was measured. A weight retention relative to the initial weight of the test piece was determined by calculation.
<Glass Transition Temperature (° C.)>
A temperature at which a change in elastic modulus was maximized (the highest rate of change in tan δ) was evaluated as the glass transition temperature by using a viscoelasticity measuring apparatus (DMA: Rheometrics Inc., solid viscoelasticity measuring apparatus RSA II, rectangular tension method: frequency 1 Hz, heating rate 3° C./min).
<Thermal Conductivity>
A plate-shaped test piece of 60×110×0.8 mm was cut out from a plate-shaped test piece formed by curing the resultant thermally conductive composition (pre-curing conditions of 170° C. and 20 minutes, post-curing conditions of 170° C. and 2 hours and 250° C. and 8 hours). The resultant plate-shaped test piece was cut into a test piece of 10×10 mm and thermal conductivity was measured by using a thermal conductivity measuring apparatus (LFA447 nano flash, manufactured by NETZSCH Inc.)
<Adhesive Strength>
Tensile shear adhesive strength was measured by using the resultant liquid resin composition. A test piece was formed by using an aluminum plate (Al 050) of 25 mm in width, 100 mm in length, and 1.5 mm in thickness as an adherend according to JIS K6850 (curing conditions of 170° C. and 2 hours and 250° C. and 8 hours).

Tensile shear adhesive strength was measured by using the formed test piece, and initial adhesive strength was measured. Next, a test piece simultaneously formed was maintained in a dryer kept at 250° C., and the tensile shear adhesive strength of the test piece taken out every hour was measured and evaluated as adhesive strength of heat resistance.

TABLE 3

|  |  | Example | | | | Comparative Example | |
|---|---|---|---|---|---|---|---|
|  |  | 2 | 3 | 4 | 5 | 2 | 3 |
| Epoxy resin (A) | A-1 | 10.0 | 8.0 | 20.0 | 10.0 |  |  |
|  | A-2 |  |  |  |  | 4.0 | 20.0 |
| Filler (B) | B-1 | 4.2 | 4.3 | 4.3 | 4.2 | 4.3 | 4.3 |
|  | B-2 | 2.8 | 2.8 | 2.9 | 2.8 | 2.9 | 2.9 |
| Curing agent | C-1 | 10.5 | 10.8 |  |  | 11.1 |  |
|  | C-2 |  |  |  | 10.6 |  |  |
| Reactive diluent | TMPL |  |  |  |  | 6.0 |  |
|  | 16HL |  | 2.0 |  |  |  |  |
| Curing accelerator | 2P4MHZ | 0.1 | 0.1 | 1.0 | 0.1 | 0.1 | 1.0 |
| Filling amount of filler (vol %) |  | 10 | 10 | 10 | 10 | 10 | 10 |
| Curing condition |  | 170° C. 20 minutes + 170° C. 2 hours + 250° C. 8 hours | | | | | |
| Heat resistance | 64 hours | 99 | 98 | 98 | 96 | 94 | Gelling during |
|  | 120 hours | 95 | 94 | 95 | 93 | 90 |  |

TABLE 3-continued

|  |  | Example | | | | Comparative Example | |
|---|---|---|---|---|---|---|---|
|  |  | 2 | 3 | 4 | 5 | 2 | 3 |
| Weight retention at 250° C. (%) | 240 hours | 92 | 91 | 92 | 90 | 88 | preparation of composition |
| Glass transition temperature (° C.) |  | 285 | 280 | 295 | 288 | 275 |  |

TABLE 4

|  |  | Example | | Comparative Example |
|---|---|---|---|---|
|  |  | 6 | 7 | 4 |
| Epoxy resin (A) | A-1 | 10.0 | 8.0 |  |
|  | A-2 |  |  | 4.0 |
| Filler (B) | B-1 | 56.7 | 56.7 | 58.4 |
|  | B-2 | 37.8 | 37.8 | 38.9 |
| Curing agent | C-1 | 10.5 | 10.5 | 11.1 |
|  | C-2 |  |  |  |
| Reactive diluent | TMPL |  |  | 6.0 |
|  | 16HL |  | 2.0 |  |
| Curing accelerator | 2P4 MHZ | 0.1 | 0.1 | 0.1 |
| Filling amount of filler (vol %) |  | 60 | 60 | 60 |
| Curing condition |  | 170° C. 20 minutes + 170° C. 2 hours + 250° C. 8 hours | | |
| Thermal conductivity (W/m · K) |  | 1.8 | 1.9 | 1.9 |
| Adhesive strength (MPa) | Initial | 6.3 | 7.9 | 6.7 |
|  | 64 hours | 3.9 | 4.3 | 2.7 |
|  | 120 hours 250° C. | 3.2 | 3.7 | 1.9 |

Notations inn Tables 3 and 4 are as follows.

(1) Epoxy Compound (A)

(A-1) 2,2',7,7'-Tetraglycidyloxy-1,1'-binaphthalene (compound obtained in Synthesis Example 2)

(A-2) Epoxy resin containing a main component with a structure represented by structural formula below, Epiclon HP-4710 (a tetrafunctional naphthalene-based epoxy resin manufactured by DIC Corporation, softening point: 95° C., melt viscosity at 150° C.: 9 dPa·s, epoxy equivalent: 170 g/equivalent)

[Chem. 5]

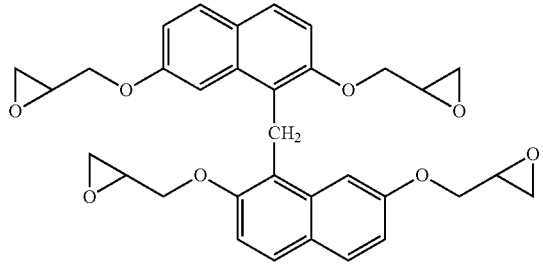

(2) Filler (B)

(B-1) AC-9500-SCX (trade name, manufactured by Admatechs Co. Ltd., aluminum oxide powder having an average particle diameter of 10 μm and surface-treated with N-phenyl-γ-aminopropyl trimethoxysilane)

(B-2) AC-2500-SXQ (trade name, manufactured by Admatechs Co. Ltd., aluminum oxide powder having an average particle diameter of 0.6 μm and surface-treated with N-phenyl-γ-aminopropyl trimethoxysilane)

(3) Curing Agent (C-1) MHAC-P (manufactured by Hitachi Chemical Co, Ltd., methyl-3,6-end-methylene-1,2,3,6-tetrahydrophthalic anhydride, molecular weight 178)

(C-2) Rikacid HNA-100 (manufactured by New Japan Chemical Co., Ltd., methylbicyclo[2.2.1]heptane-2,3-dicarboxylic anhydride/bicyclo[2.2.1]heptane-2,3-dicaboxylic anhydride)

(4) Reactive Diluent (TMPL) SR-TMPL (manufactured by Sakamoto Yakuhin Kogyo Co., Ltd., trimethylolpropane polyglycidyl ether, epoxy equivalent 137)

(16HL) SR-16HL (manufactured by Sakamoto Yakuhin Kogyo Co., Ltd., 1,6-hexanediol diglycidyl ether, epoxy equivalent 125)

(5) Curing Accelerator (2P4MHZ) Curesol 2P4MHZ-PW (manufactured by Shikoku Chemicals Corporation, 2-phenyl-4-methyl-5-hydroxymethyl imidazole)

The results shown in Tables 1 to 4 indicate that the epoxy resin of the present invention has a low softening temperature and low melt viscosity, and a cured product thereof has good solvent solubility and excellent heat resistance and flame retardancy while maintaining low moisture absorption and low coefficient of thermal expansion which are characteristic of naphthalene-based tetrafunctional epoxy resins.

INDUSTRIAL APPLICABILITY

An epoxy resin composition of the present invention is useful for electronic materials and heat dissipation materials and can be particularly preferably used as a semiconductor encapsulating material, a material for an electronic circuit board, and a thermally conductive adhesive.

The invention claimed is:

1. An epoxy resin composition which is a curable resin composition comprising an epoxy resin (A) and a filler (B), wherein the epoxy resin (A) is 2,2',7,7'-tetraglycidyloxy-1, 1'-binaphthalene.

2. The epoxy resin composition according to claim 1, wherein the filler (B) is a thermally conductive filler.

3. The epoxy resin composition according to claim 2, wherein the thermally conductive filler has a thermal conductivity of 10 W/m·K or more.

4. The epoxy resin composition according to claim 2, wherein the thermally conductive filler is at least one selected from alumina, magnesium oxide, zinc oxide, beryllia, boron nitride, aluminum nitride, silicon nitride, silicon carbide, boron carbide, titanium carbide, and diamond.

5. The epoxy resin composition according to claim 2, wherein the epoxy resin composition is a thermally conductive adhesive.

6. The epoxy resin composition according to claim 1, wherein the filler (B) is silica.

7. The epoxy resin composition according to claim 1, further comprising a fibrous base material.

8. The epoxy resin composition according to claim 1, wherein the epoxy resin composition is used for an electronic material.

9. A cured product produced by curing the epoxy resin composition according to claim 1.

10. A heat dissipation material comprising a cured product produced by curing the epoxy resin composition according to claim 1.

11. An electronic material comprising a cured product produced by curing the epoxy resin composition according to claim 1.

12. The epoxy resin composition according to claim 3, wherein the thermally conductive filler is at least one selected from alumina, magnesium oxide, zinc oxide, beryllia, boron nitride, aluminum nitride, silicon nitride, silicon carbide, boron carbide, titanium carbide, and diamond.

13. The epoxy resin composition according to claim 3, wherein the epoxy resin composition is a thermally conductive adhesive.

14. The epoxy resin composition according to claim 4, wherein the epoxy resin composition is a thermally conductive adhesive.

15. The epoxy resin composition according to claim 6, further comprising a fibrous base material.

16. The epoxy resin composition according to claim 6, wherein the epoxy resin composition is used for an electronic material.

17. The epoxy resin composition according to claim 7, wherein the epoxy resin composition is used for an electronic material.

18. A cured product produced by curing the epoxy resin composition according to claim 2.

19. A heat dissipation material comprising a cured product produced by curing the epoxy resin composition according to claim 2.

20. An electronic material comprising a cured product produced by curing the epoxy resin composition according to claim 6.

* * * * *